(12) United States Patent
Sun et al.

(10) Patent No.: US 7,846,643 B1
(45) Date of Patent: Dec. 7, 2010

(54) METHOD AND SYSTEM FOR PROVIDING A STRUCTURE IN A MICROELECTRONIC DEVICE USING A CHROMELESS ALTERNATING PHASE SHIFT MASK

(75) Inventors: Hai Sun, Milpitas, CA (US); Winnie Yu, San Jose, CA (US); Hongping Yuan, Fremont, CA (US); Yizhong Wang, Woodbury, MN (US); Xianzhong Zeng, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 475 days.

(21) Appl. No.: 11/934,599

(22) Filed: Nov. 2, 2007

(51) Int. Cl.
*G03F 1/00* (2006.01)
(52) U.S. Cl. .......................... 430/313; 430/5
(58) Field of Classification Search ................ 430/311, 430/5, 319, 320, 313, 314, 315
See application file for complete search history.

(56) References Cited

U.S. PATENT DOCUMENTS

| | | | |
|---|---|---|---|
| 5,487,962 A | 1/1996 | Rolfson | |
| 5,533,634 A | 7/1996 | Pan et al. | |
| 6,376,130 B1 * | 4/2002 | Stanton | 430/5 |
| 6,664,009 B2 | 12/2003 | Liu | |
| 6,713,237 B2 * | 3/2004 | Seigler et al. | 430/314 |
| 6,851,103 B2 | 2/2005 | Van Den Broeke et al. | |
| 7,014,962 B2 | 3/2006 | Lin et al. | |
| 7,030,966 B2 | 4/2006 | Hansen | |
| 7,063,921 B2 | 6/2006 | Dettman et al. | |
| 7,074,529 B2 | 7/2006 | Butt et al. | |
| 7,090,964 B2 | 8/2006 | Baba-Ali et al. | |
| 7,160,651 B2 | 1/2007 | Pinkerton et al. | |
| 2004/0101765 A1 | 5/2004 | Sivakumar et al. | |
| 2006/0240332 A1 | 10/2006 | Hung et al. | |

* cited by examiner

*Primary Examiner*—Kathleen Duda
*Assistant Examiner*—Caleen O Sullivan

(57) ABSTRACT

A method and system for providing a microelectric device, such as a magnetoresistive read sensor are described. The method and system include providing a mask layer on the microelectric device. The method and system further include exposing the mask layer to provide a mask. A portion of the mask covers a portion of the microelectric device. The step of exposing the mask layer further includes utilizing a chromeless alt-phase shift mask for providing the portion of the mask.

12 Claims, 11 Drawing Sheets

METHOD AND SYSTEM FOR PROVIDING A STRUCTURE IN A MICROELECTRONIC DEVICE USING A CHROMELESS ALTERNATING PHASE SHIFT MASK

BACKGROUND

FIG. 1 depicts a conventional method 10 for fabricating a structure, such as a read sensor, in a conventional microelectric device such as a read transducer. For clarity, therefore, the method 10 is described in the context of providing a read sensor in a read transducer. FIGS. 2-4 depict the conventional read transducer 30 during fabrication using the conventional method 10. FIGS. 5-6 depict plan and side views of the alternating phase shift mask (alt-PSM) 40 used in the conventional method 10. FIGS. 7-8 depict the field 50 and intensity 60 during fabrication using the conventional method 10. For clarity, FIGS. 2-8 are not to scale.

Referring to FIGS. 1-8, layers for the read sensor are fabricated on an underlying substrate, via step 12. A photoresist layer is provided on the read sensor layer(s), via step 14. The photoresist layer is assumed to be a positive photoresist, in which areas exposed to light are removed. FIG. 2 depicts the microelectric device 30 after step 14 is performed. Thus, the read sensor layers 34 reside on the underlying layer 32. The underlying layer 32 is typically an insulator, such as alumina. The read sensor layer(s) typically include more than one layer, for example reference layer(s), nonmagnetic spacer layer, and a free layer having a magnetization that may rotate in response to an external field. A photoresist layer 36 is shown on top of the read sensor layer(s).

The photoresist layer 36 is exposed using a conventional alternating phase shift mask (alt-PSM), via step 16. FIGS. 5-6 depict plan and side views of the conventional alt-PSM 40. The conventional alt-PSM 40 includes a first quartz region 42, a second quartz region 44, and a chrome line 46 between the quartz regions 42 and 44. The first quartz region 42 is thicker than the second quartz region 46. FIGS. 7-8 depict the field 50 and intensity 60 transmitted by the FIGS. 7-8 depict the field 50 and intensity 60 during fabrication using the conventional method 10 in the step 16. Because of the differences in thicknesses of the quartz regions 42 and 44, the electric field 50 is out of phase for the two sides. However, the intensity 60 is still large in these regions. In the region of the chrome line 46, no light is transmitted. Thus, the chrome line 46 corresponds to the portion of the mask layer 36 that is to remain. Because the photoresist layer was exposed in step 16, a photoresist mask is created. FIG. 3 depicts the conventional read transducer 30 after step 16 has been performed. Thus, a photoresist line 36' has been formed. The photoresist line 36' corresponds to the chrome line 46.

The read sensor layer(s) 34 are etched using the photoresist line 36' as a mask, via step 18. FIG. 4 depicts the conventional read transducer 30 after step 18 has been performed. Thus, the read sensor 34' has been defined. Fabrication of the device may then be completed, via step 20.

Although the conventional method 10 may be used for microelectronic devices, such as read transducers, there are drawbacks. The method 10 and conventional alt-PSM 40 may be capable of fabricating lines having widths of approximately fifty nanometers or greater. However, the conventional method 10 using the conventional alt-PSM 40 may not be capable of adequately defining line widths of in the sub-50 nm regime. In order to fabricate structures in the sub-50 nm regime, the chrome line 46 of the alt-PSM mask 40 is required to be very thin. The manufacture of a conventional alt-PSM 40 having such a thin chrome line 46 becomes more challenging. Even if such a conventional alt-PSM 40 can be manufactured, the line width of the chrome line 46 may become less uniform. As a result, the width of the photoresist line 36', as well as the structure being defined, may be less uniform. In semiconductor microelectric devices, a scheme utilizing chromeless phase shift lithography with assist features and off-axis illumination schemes has been proposed. However, an improved method for enhancing resolution of lithography, for example in the sub-fifty nanometer regime, is still desired.

Accordingly, what is needed is a system and method for improving the fabrication of microelectric devices, such as read transducers.

BRIEF SUMMARY OF THE INVENTION

A method and system for providing a microelectric device, such as a magnetoresistive read sensor are described. The method and system include providing a mask layer on the microelectric device. The method and system further include exposing the mask layer to provide a mask. A portion of the mask covers a portion of the microelectric device. Exposing the mask layer further includes utilizing a chromeless alt-phase shift mask for providing the portion of the mask.

DETAILED DESCRIPTION OF THE PREFERRED EMBODIMENTS

Figure 1:
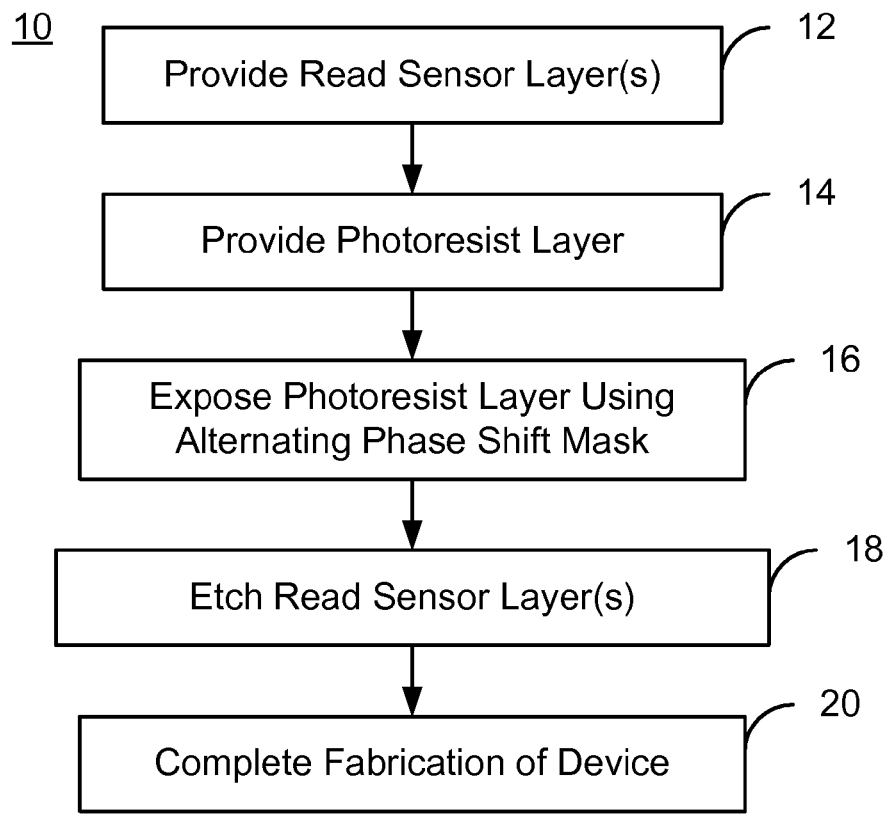
FIG. 1 is a flow chart depicting a conventional method for providing a conventional read sensor.
Figure 2:
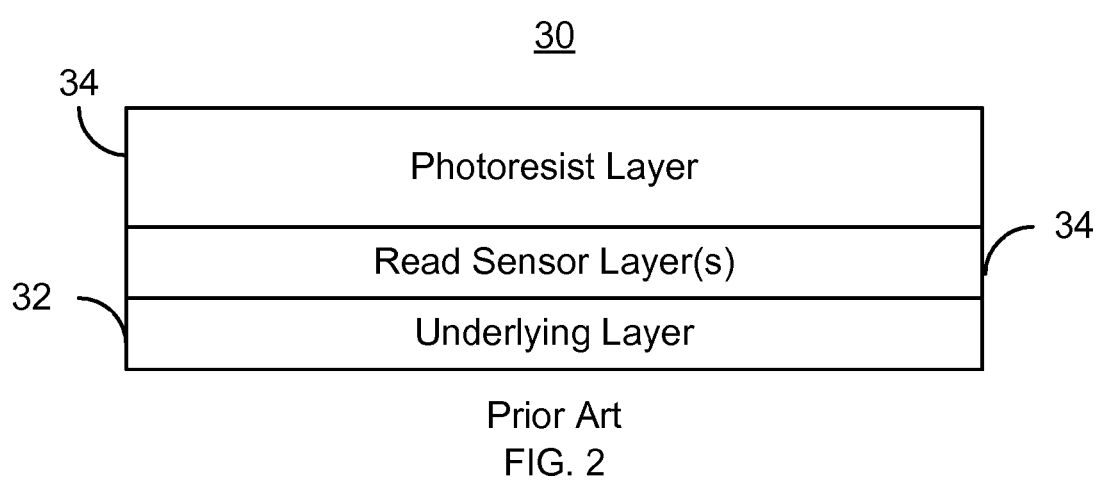
FIGS. 2-4 depict a conventional read transducer during fabrication.
Figure 3:
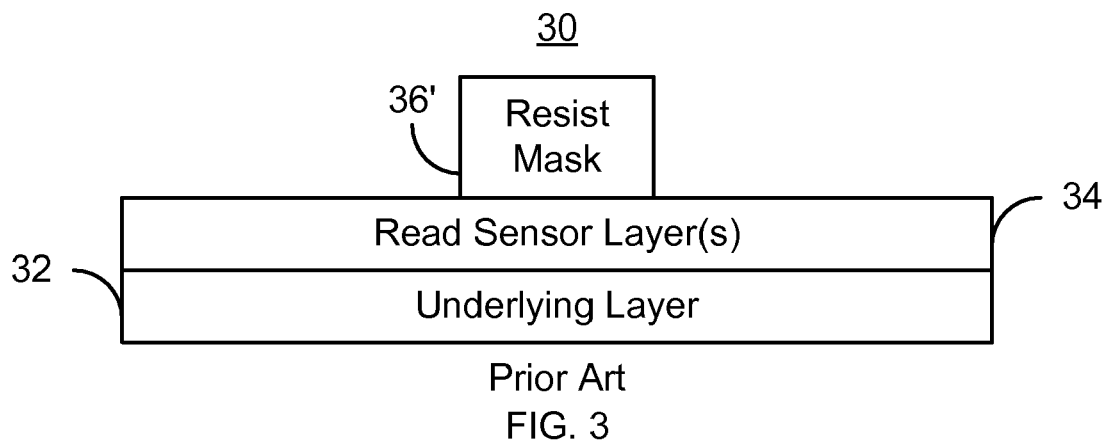
Figure 4:
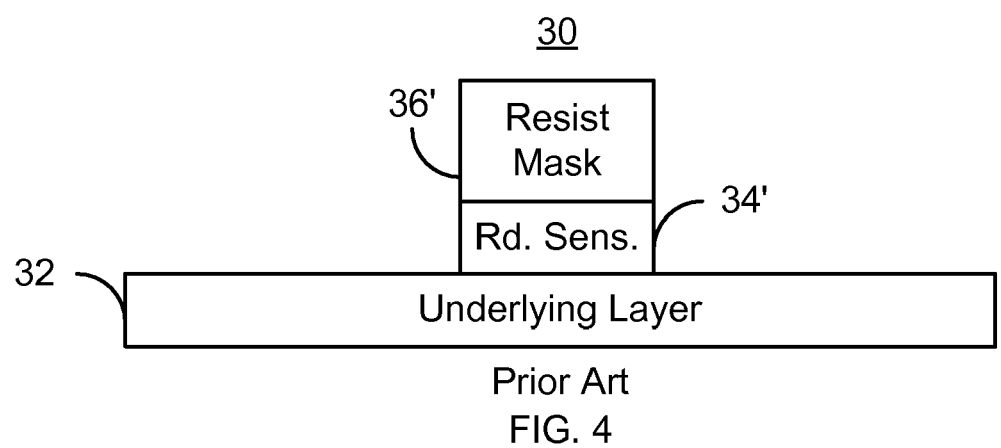
Figure 5:
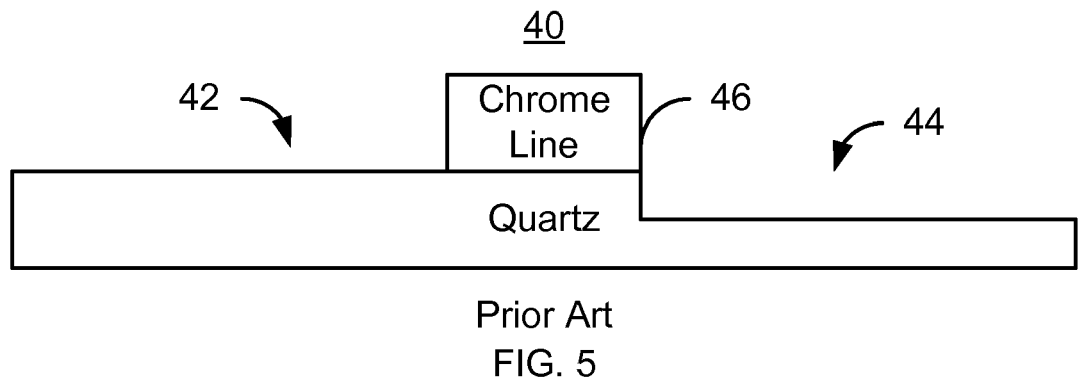
FIGS. 5-6 depict side and plan views of the alternating phase shift mask.
Figure 6:
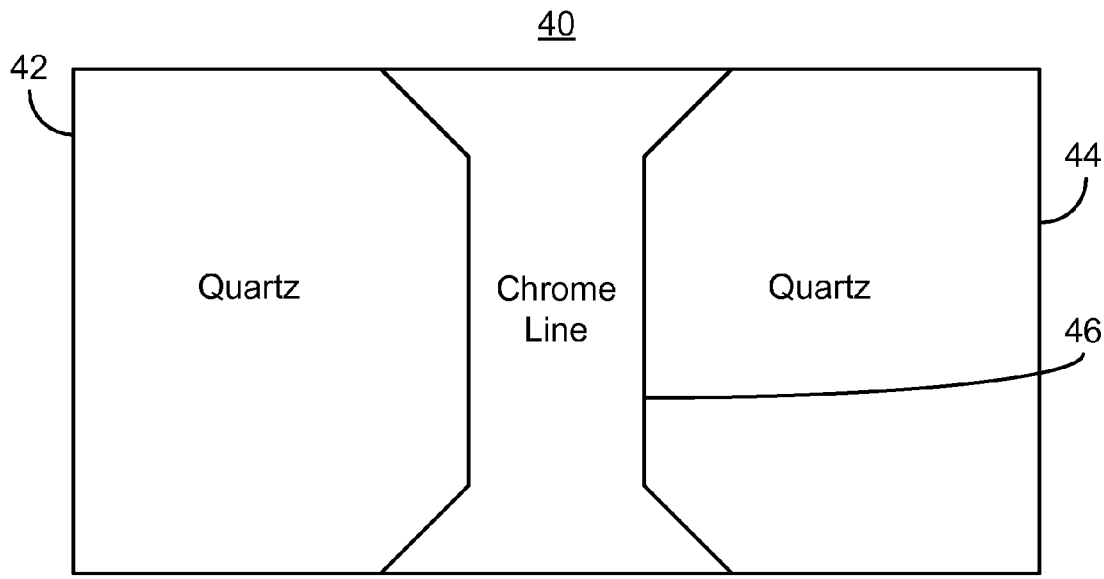
Figure 7:
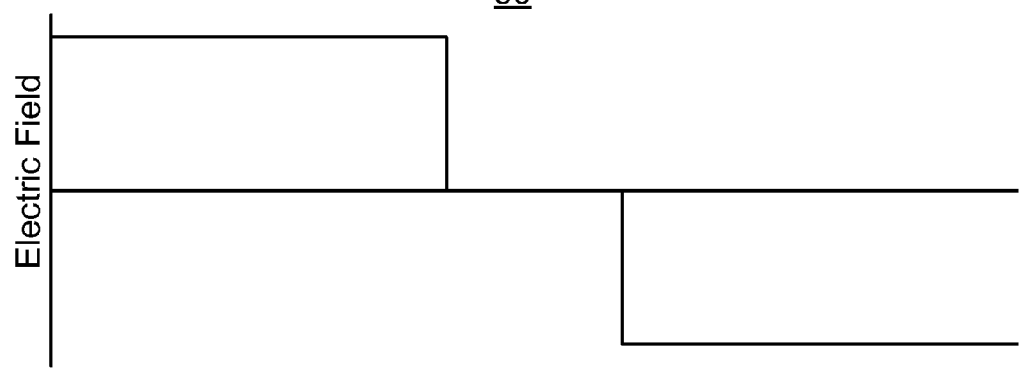
FIGS. 7-8 depict the field and intensity during fabrication using the conventional method.
Figure 8:
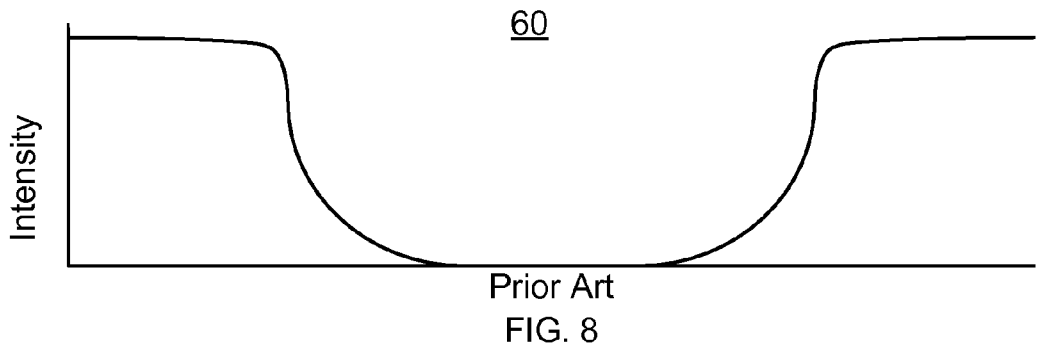
Figure 9:
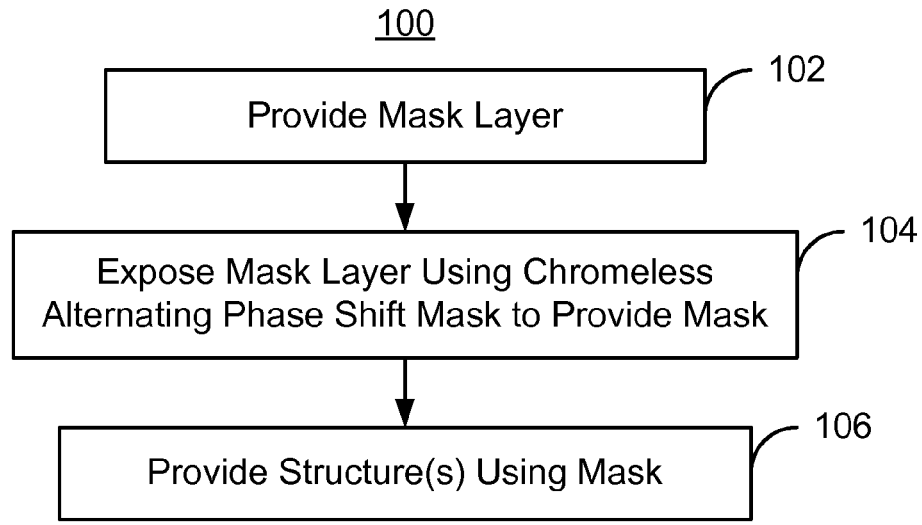
FIG. 9 is a flow chart depicting an exemplary embodiment of a method for providing a structure in a microelectric device

FIG. 9 is a flow chart depicting an exemplary embodiment of a method 100 for fabricating a structure in a microelectric device, such as a read transducer. For simplicity, some steps in the method 100 may be omitted. In addition, other and/or additional steps not inconsistent with the method and system may be used. The method 100 is described in the context of defining a read sensor of a read transducer. However, in another embodiment, the method 100 may be used in providing another structure that may be in another type of head and/or another type of microelectric device. For example, the method 100 may be used in providing a conductive line.

Figure 10:
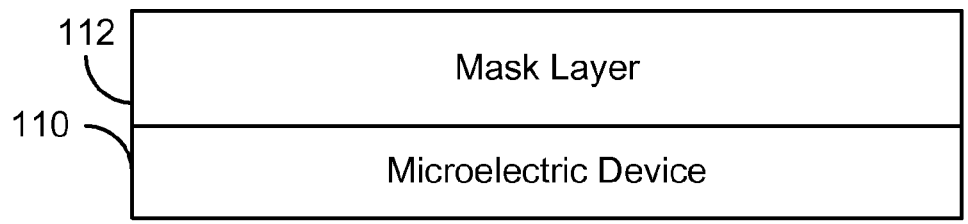
FIGS. 10-11 depict an exemplary embodiment of a microelectric device during fabrication.
Figure 11:
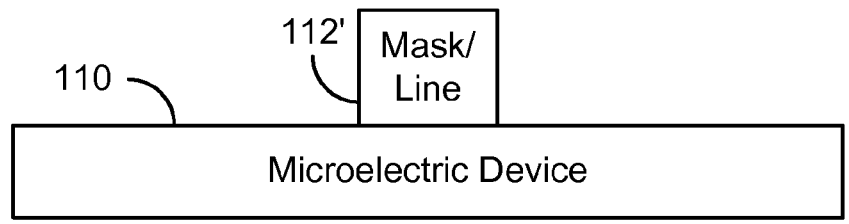
Figure 12:
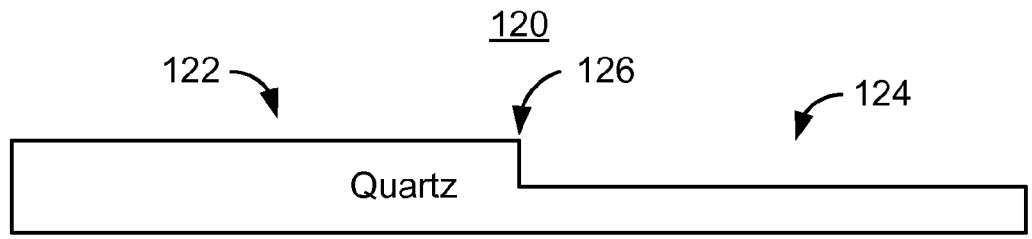
FIGS. 12-13 depict side and plan views of an exemplary embodiment of a chromeless alternating phase shift mask used in fabricating the microelectric device.
Figure 13:
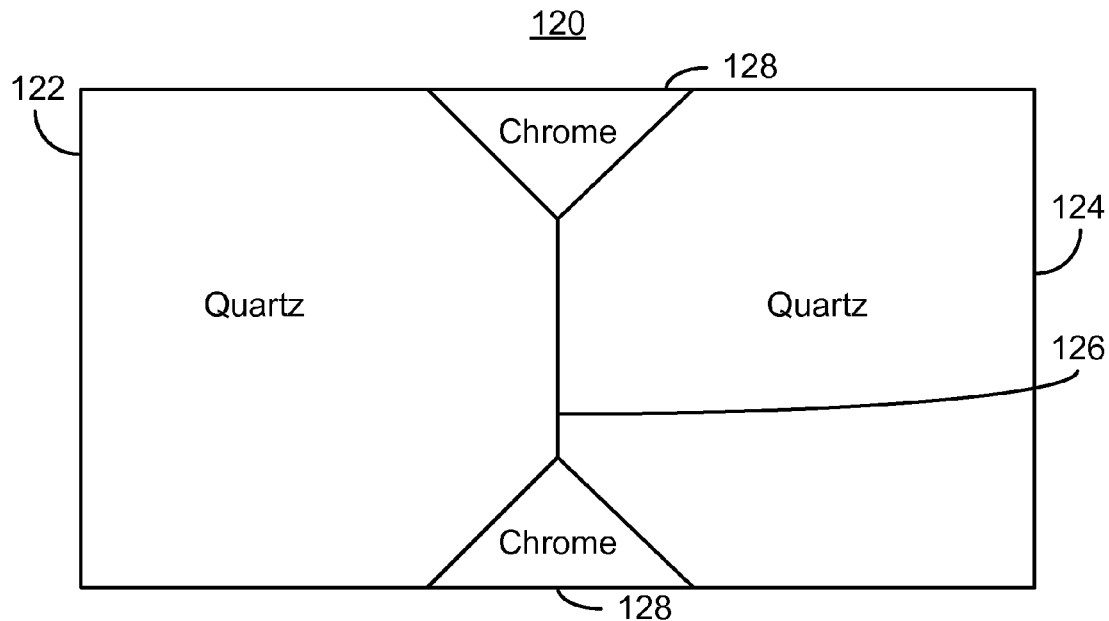
Figure 14:
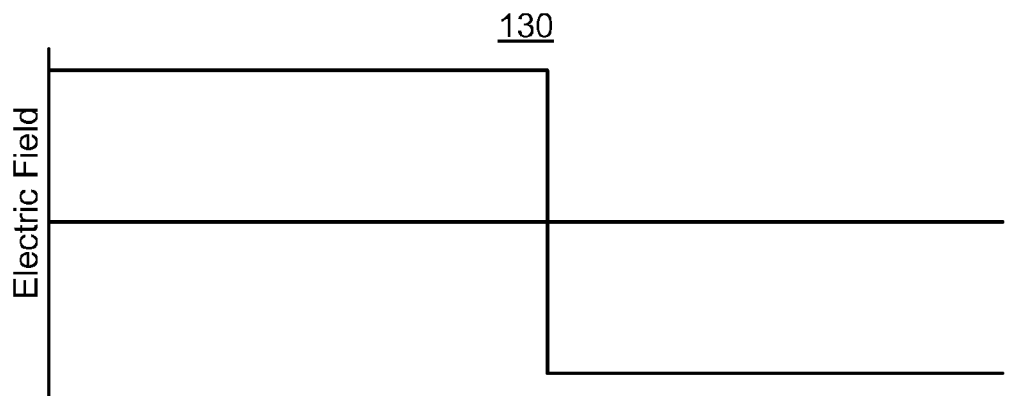
FIGS. 14-15 depict an exemplary embodiment of the field and intensity during fabrication of the microelectric device.
Figure 15:
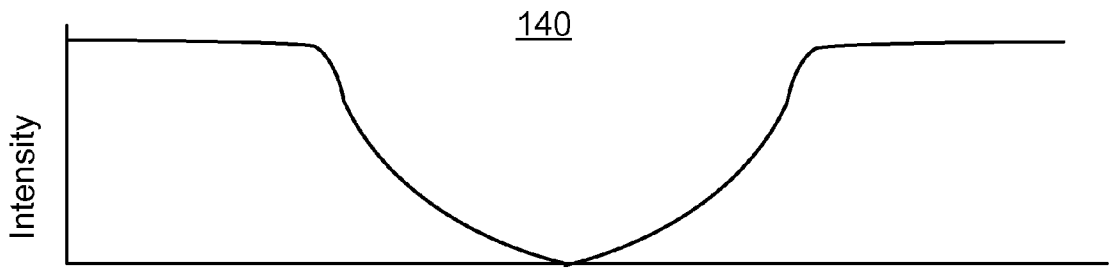

The method 100 is also described in the context of FIGS. 10-15. FIGS. 10-11 depict an exemplary embodiment of a microelectric device 110 during fabrication using the method 100. FIGS. 12-13 depict side and plan views of an exemplary embodiment of a chromeless alternating phase shift mask (chromeless alt-PSM) 120 used in the method 100. FIGS. 14-15 depict an exemplary embodiment of the field 130 and intensity 140 transmitted by the chromeless alt-PSM 120 during fabrication using the method 100.

Referring to FIGS. 9-15, a mask layer is provided on the microelectric device, via step 102. In one embodiment, the mask layer is a photoresist mask layer. In one embodiment the photoresist used is positive photoresist. However, in another embodiment, another type of mask may be used. FIG. 10 depicts the microelectric device 110 after step 102 is performed. Thus, the microelectric device 110 and the mask layer 112 are shown.

The mask layer 112 is exposed using a chromeless alt-PSM 120, via step 104. FIGS. 12-13 depict side and plan views of the chromeless alt-PSM 120 used in step 104. The chromeless alt-PSM 120 includes a thick quartz region 122 and a thin quartz region 124 separated by transition 126. Also shown in FIG. 13 are chrome regions 128, which may exist as away from the region of interest using in fabricating the desired structure. FIGS. 14-15 depict the electric field 130 and intensity 140 transmitted by the chromeless alt-PSM 120 during step 104. Because of the differences in thickness of regions 122 and 124, the electric field 130 transmitted by the region 124 is out of phase with that transmitted by the thick region 122. The intensity 140 transmitted by both regions 122 and 124 is still large. However, the intensity 140 transmitted by the chromeless alt-PSM 120 at the transition 126 is very small. As a result, a portion of the mask layer 112 corresponding to the transition 126 is not illuminated. The portion of the mask layer 112 that corresponds to the transition 126 is the line 112' depicted in FIG. 11. Thus, the exposing the mask layer 112 using the chromeless alt-PSM 120 in step 104 results in a mask including the line 112'. The line 112' may be part or all of the mask formed in step 104.

The desired structure(s) for the microelectric device may be provided using the mask including the line 112', via step 106. In one embodiment, the line 112' may be used to cover a desired portion of the microelectric device 110. For example, in one embodiment, the line 112' is provided on layer(s) that are part of a structure to be formed. An etch may then be performed while the line 112' remains in place as a mask. The remaining portion of the layer(s) resides under the line 112'. Such an embodiment might be used in fabricating a conductive line or read sensor. Alternatively, the line 112' may be used to remove a portion of the microelectric device 110. For example, the line 112' may be provided and layer(s) that may be part of the structure or used in providing the structure deposited on the line 112'. The line 112' may then be lifted off. As a result, a trench is provided in the layer(s).

Using the method 100, desired structure(s) in the microelectric device 110 may be fabricated. Because the chromeless alt-PSM 120 is used in the method 100, the line 112' printed may have a smaller width. In particular, the line 112' may have a line width that is less than fifty nanometers. Consequently, structures fabricated using the line 112' may have a width that is less than fifty nanometers. In addition to being in the sub-50 nm regime, the width of the line 112', and thus structure(s) fabricated using the line 112', may be more uniform. Consequently, higher resolution structures in the microelectric device 110 may be provided using the method 100.

Figure 16:
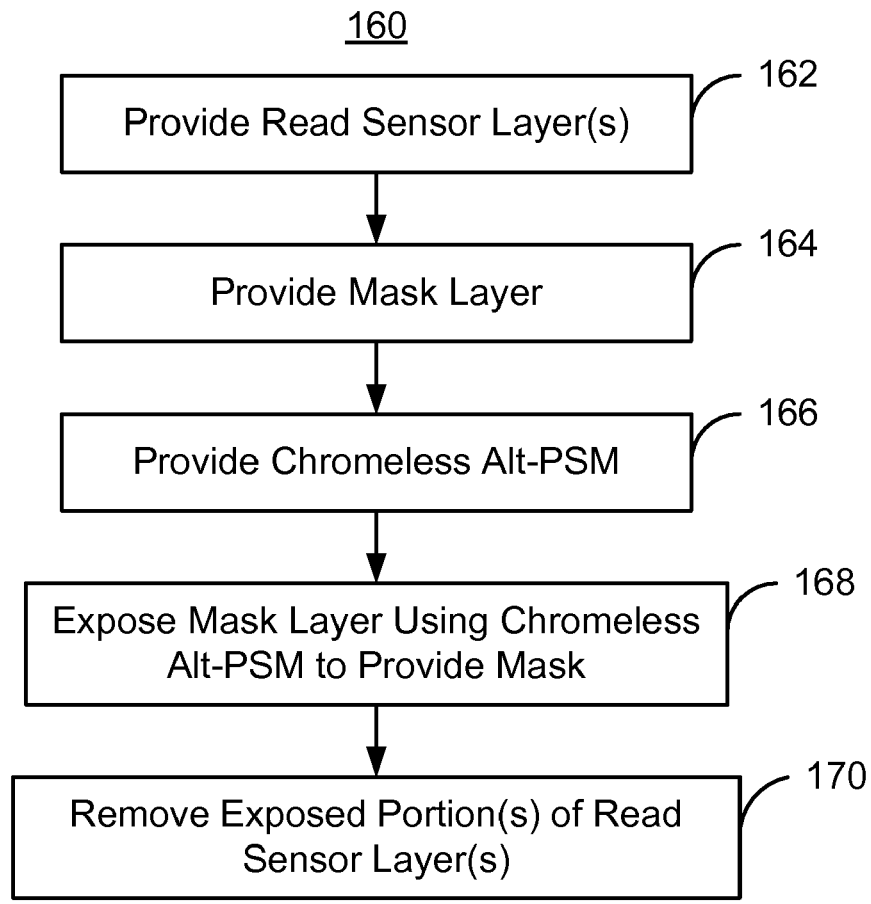
FIG. 16 is a flow chart depicting an exemplary embodiment of a method for providing a structure in a read transducer.
Figure 17:
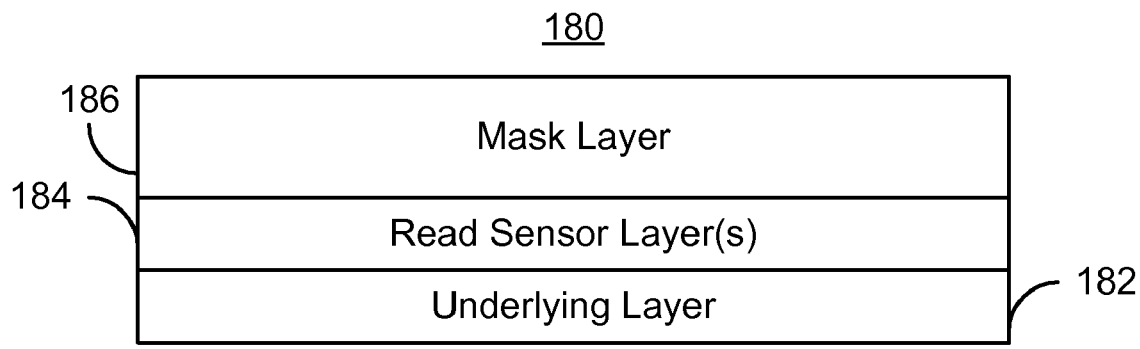
FIGS. 17-19 depict an exemplary embodiment of a read transducer during fabrication.
Figure 18:
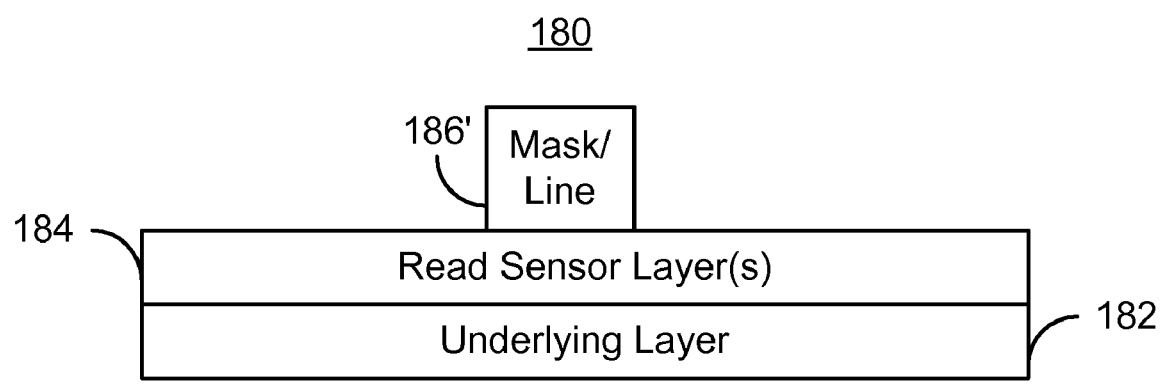
Figure 19:
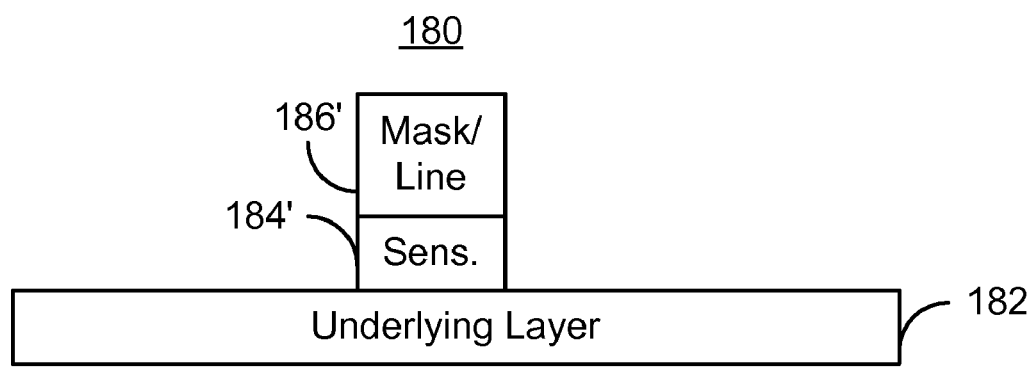

FIG. 16 is a flow chart depicting an exemplary embodiment of a method 160 for providing a structure in a read transducer. The method 160 may be viewed as an application of the method 100. For simplicity, some steps in the method 160 may be omitted. In addition, other and/or additional steps not inconsistent with the method and system may be used. The method 160 is described in the context of and may be used for defining a read sensor of a read transducer. However, in another embodiment, the method 160 may be used in providing another structure that may be in another type of head and/or another type of microelectric device. For example, the method 160 may be used in providing a conductive line. The method 160 is also described in the context of FIGS. 17-19. FIGS. 17-19 depict an exemplary embodiment of a read transducer 180 during fabrication using the method 160. For clarity, FIGS. 17-19 are not drawn to scale. The method 160 is also described in the context of the chromeless alt-PSM 120 depicted in FIGS. 12-13. However, in another embodiment, another chromeless alt-PSM may be used.

Referring to FIGS. 16-19, at least one read sensor layer is provided, via step 162. In one embodiment, step 162 includes providing multiple layers. For example, reference layer(s), nonmagnetic spacer layer(s), and free layer(s) having a magnetization that may rotate in response to an external field may be provided in step 162. In one embodiment, the read sensor layer(s) are provided on an underlying layer, such as alumina. In another embodiment, other layers including for another structure, may be provided.

A mask layer is provided on the read sensor layer(s), via step 164. In one embodiment, the mask layer is a positive photoresist layer. However, in another embodiment, another type of mask layer might be used. FIG. 17 depicts the read transducer 180 after step 164 is performed. Thus, a mask layer 186 residing on read sensor layers 184 are shown. Also depicted is an underlying layer 182, such as an insulator.

The chromeless alt-PSM 120 is optionally provided, via step 166. In one embodiment, step 166 may include fabricating the chromeless alt-PSM 120. In another embodiment, the chromeless alt-PSM 120 may be obtained, for example from a vendor who may have been given specifications for the chromeless alt-PSM.

The mask layer 186 is exposed using a chromeless alt-PSM 120, via step 168. Because of the differences in thickness of regions 122 and 124, the electric field (not shown) transmitted by the region 124 is out of phase with that transmitted by the thick region 122. The intensity (not shown) of light transmitted by both regions 122 and 124 is still large. However, the intensity transmitted by the chromeless alt-PSM 120 at the transition 126 is very small. As a result, a portion of the mask layer 186 corresponding to the transition 126 is not illuminated. Consequently, as shown in FIG. 18, the line 186' remains after step 166. The line 186' may be part or all of the mask formed in step 168.

At least one read sensor is defined the mask 186', via step 170. In one embodiment, step 170 includes removing a portion of the read sensor layer(s) exposed by the mask 186', for example via an ion mill or etch process. FIG. 19 depicts the read transducer 180 after step 170 has been performed. Consequently, a read sensor 184' has been defined. Note that for clarity, only one read sensor 184 is provided. However, in another embodiment, multiple read sensors may be fabricated together. Thus, the read sensor 184' is defined in step 170.

Using the method 160, read sensor(s) may be fabricated. Because the chromeless alt-PSM 120 is used in the method 160, the line 186' printed may be thinner. In particular, the line 186' may have a line width that is less than fifty nanometers. In addition to being in the sub-50 nm regime, the width of the line 186' may be more uniform. Consequently, the read sensor 184' may be made less wide while retaining sufficient uniformity.

Figure 20:
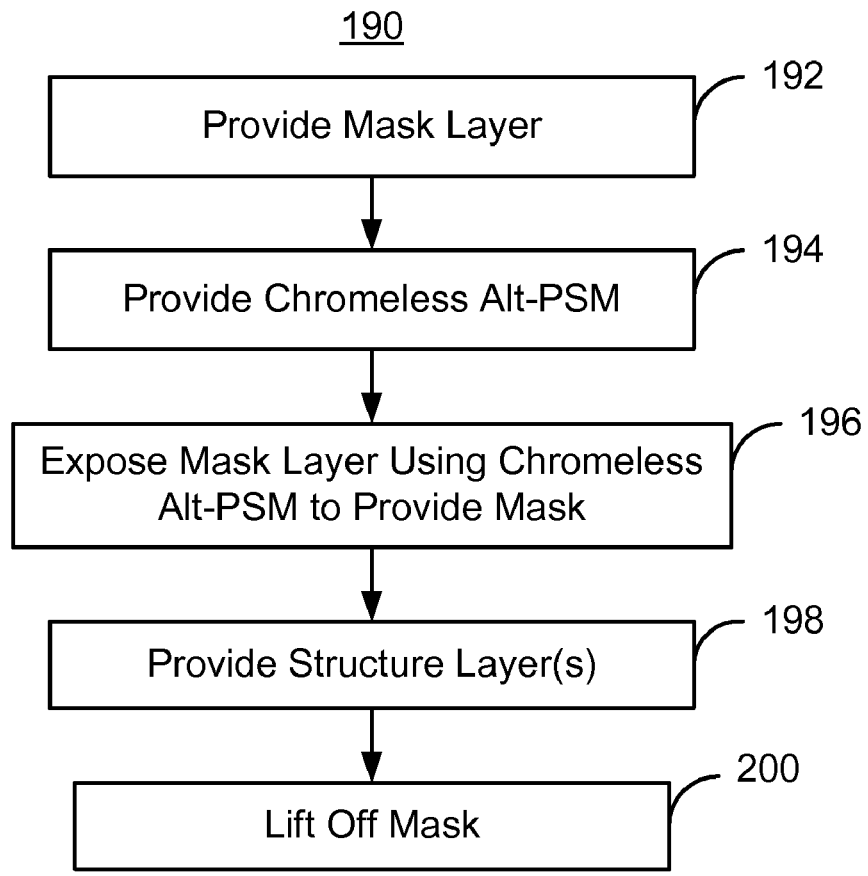
FIG. 20 is a flow chart depicting another exemplary embodiment of a method for providing a structure in a write head.
Figure 21:
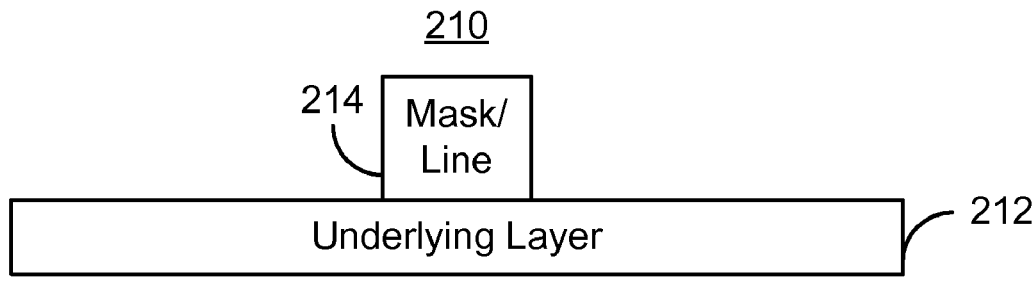
FIGS. 21-23 depict an exemplary embodiment of a read transducer during fabrication.
Figure 22:
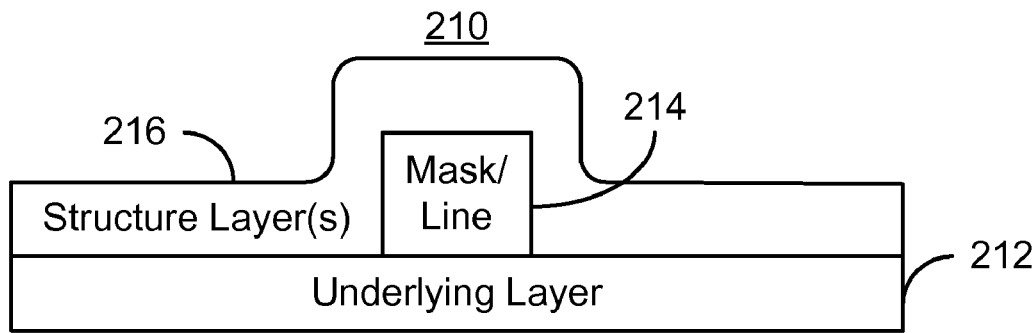
Figure 23:
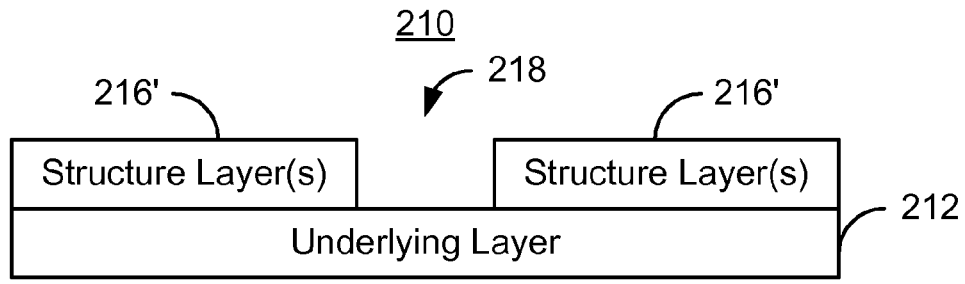

FIG. 20 is a flow chart depicting another exemplary embodiment of a method 190 for providing a structure in a read transducer. The method 190 may be viewed as an application of the method 100. For simplicity, some steps in the method 190 may be omitted. In addition, other and/or additional steps not inconsistent with the method and system may be used. The method 190 is described in the context of and preferably used for defining a structure in a read transducer. However, in another embodiment, the method 190 may be used in providing another structure that may be in another type of head and/or another type of microelectric device. For example, the method 190 may be used in providing a conductive line. The method 190 is also described in the context of FIGS. 21-23, which depict an exemplary embodiment of a read transducer 210 during fabrication using the method 190. For clarity, FIGS. 21-23 are not drawn to scale. Note that for simplicity, only one structure is depicted. However, in one embodiment, multiple structures may be fabricated together. The method 190 is also described in the context of the chromeless alt-PSM 120 depicted in FIGS. 12-13. However, in another embodiment, another chromeless alt-PSM may be used.

Referring to FIGS. 20-23, a mask layer is provided on the read transducer, via step 192. In one embodiment, the mask layer is a positive photoresist layer. However, in another embodiment, another type of mask layer might be used.

The chromeless alt-PSM 120 is optionally provided, via step 194. In one embodiment, step 194 may include fabricating the chromeless alt-PSM 120. In another embodiment, the chromeless alt-PSM 120 may be obtained, for example from a vendor who may have been given specifications for the chromeless alt-PSM.

The mask layer is exposed using a chromeless alt-PSM 120, via step 196. Because of the differences in thickness of regions 122 and 124, the electric field (not shown) transmitted by the region 124 is out of phase with that transmitted by the thick region 122. The intensity (not shown) of light transmitted by both regions 122 and 124 is still large. However, the intensity transmitted by the chromeless alt-PSM 120 at the transition 126 is very small. As a result, a portion of the mask layer corresponding to the transition is not illuminated. FIG. 21 depicts the read transducer 210 after step 196 is performed. Thus, a mask, including line 214, residing on an underlying layer 212 is shown. The line 186' may be part or all of the mask formed in step 196.

At least one layer for the structure(s) being formed is provided, via step 198. In one embodiment, step 192 includes providing multiple layers. For example, seed layers and conductive or insulating layers may be provided in step 198. FIG. 22 depicts the read transducer 210 after step 198 is performed. Thus, in addition to the line 214, structure layer(s) 216 are shown. Note that the structure layer(s) may be layers actually in the structure(s) or layers used in fabricating the desired structure(s).

The mask 214 is lifted off, via step 200. In one embodiment, step 200 includes removing a portion of the layer(s) 216 formed on the mask 214. Thus, a trench is formed in the layer(s) 216. FIG. 23 depicts the read transducer 210 after the mask 214' has been lifted off. Consequently, remaining portions 216' of the layers and trench 218 therein are shown. In one embodiment, the structure is formed in the trench 218. In another embodiment, the layers 216' form the desired structure.

Using the method 190, structure(s) in the read transducer may be fabricated. Because the chromeless alt-PSM 120 is used in the method 190, the line 214 printed may be thinner. In particular, the line 214 may have a line width that is less than fifty nanometers. Similarly, the trench 218 may have a width that is less than fifty nanometers in width. In addition to being in the sub-50 nm regime, the widths of the line 214 and trench 218 may be more uniform. Consequently, the desired structures may be made less wide while retaining sufficient uniformity.

Figure 24:
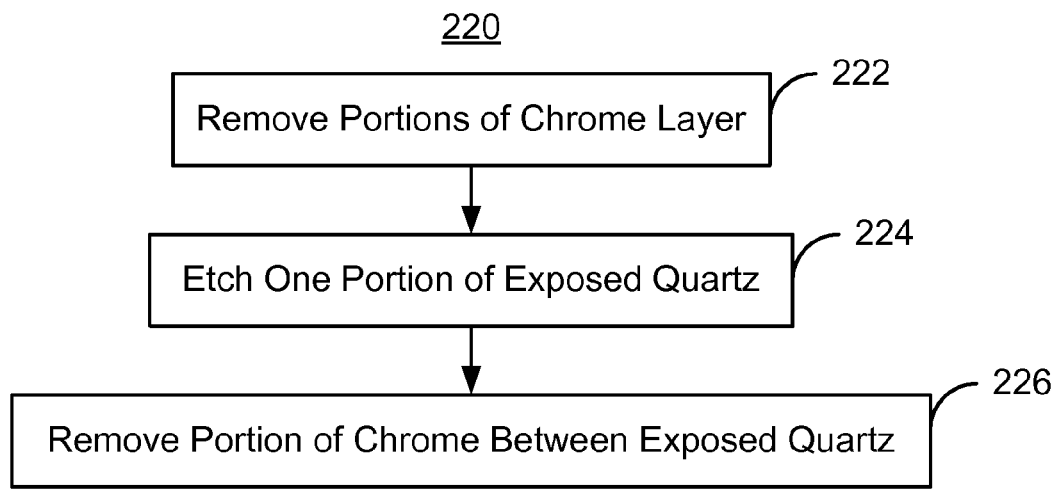
FIG. 24 is a flow chart depicting an exemplary embodiment of a method for providing a chromeless alternating phase shift mask.
Figure 25:
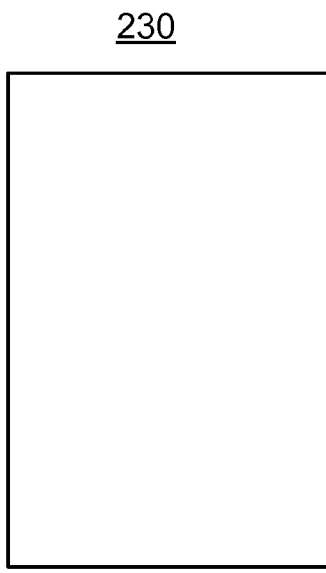
FIGS. 25-28 depict an exemplary embodiment of a chromeless alternating phase shift mask during fabrication.

FIG. 24 is a flow chart depicting an exemplary embodiment of a method 220 for providing a chromeless alt-PSM, such as the chromeless alt-PSM 120. The method 220 is described in connection with FIGS. 25-28, which depict plan views of an exemplary embodiment of a chromeless alt-PSM 230 during fabrication. Referring to FIGS. 24-28, the method 220 is formed from a layer of quartz covered in chrome. FIG. 25 depicts the chromeless alt-PSM 230 before the method 220 commences. Consequently, the chrome layer 232 is shown, while the underlying quartz is not.

Figure 26:
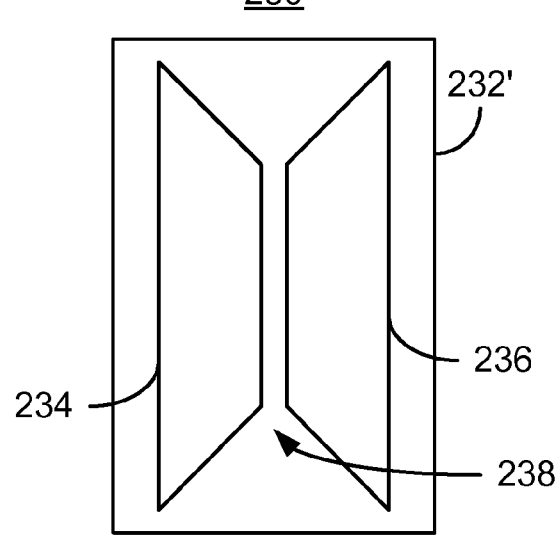

First and second portions of the chrome layer 232 are removed, via step 222. Step 222 may include forming a pattern on the chromeless alt-PSM 230 that exposes portions of the chrome layer 232 and performing a chrome etch. FIG. 26 depicts the chromeless alt-PSM 230 after step 222 is completed. Thus, portions 234 and 236 of the underlying quartz are exposed by apertures in the remaining the etched chrome 232'. The remaining chrome 232' includes a chrome line 238 between the quartz portions 234 and 236.

Figure 27:
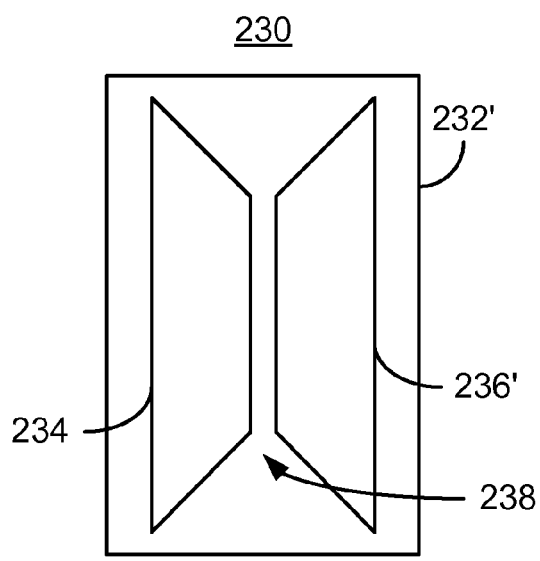

The quartz portion(s) 234 and 236 are etched, via step 224. In one embodiment, step 224 includes performing a quartz etch such that the quartz portions 234 and 236 transmit light that is one hundred and eighty degrees out of phase. In one embodiment, only one of the quartz portions 234 and 236 is etched. In such an embodiment, step 224 may include forming a pattern on the chromeless alt-PSM 230 that exposes one of the quartz portions 234 and 236, then performing a quartz etch. FIG. 27 depicts the chromeless alt-PSM 230 after step 224 is completed. In the embodiment shown, the quartz portion 236' has been etched, while the quartz portion 234 has not undergone an additional etch. Consequently, the quartz portion 236' is thinner than the quartz portion 234.

Figure 28:
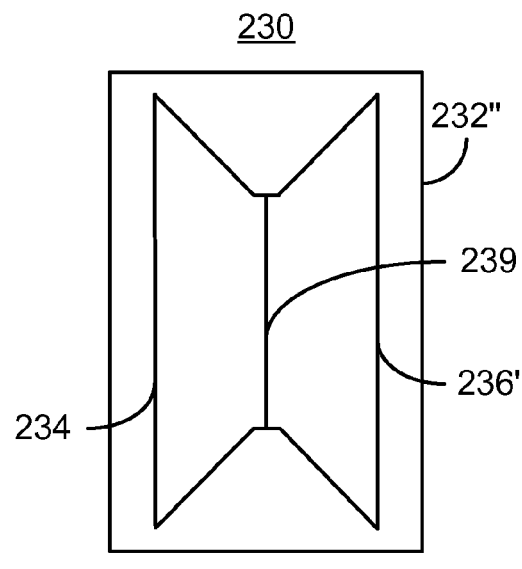

The chrome line 238 is removed, via step 226. Step 226 may include forming a pattern on the chromeless alt-PSM 230 that exposes the chrome line 238 and performing a chrome etch. FIG. 28 depicts the chromeless alt-PSM 230 after step 226 is performed. Because the chrome line 238 has been removed, the chrome layer 232" exposes the transition 239 between the quartz portions 234 and 236'. In the chromeless alt-PSM 230, the quartz portions 234 and 236' and transition 239 correspond to the portions 122 and 124 and transition 126 of the chromeless alt-PSM 120. In addition, it is noted that the remaining chrome 232" may have flat edges at the transition 239.

Thus, using the method 220, a chromeless alt-PSM 230 having quartz regions 234 and 236' and a transition 239 therebetween may be formed. Consequently, the chromeless alt-PSM 230 may be used in fabricating microelectric devices, such as read transducers. Thus, the chromeless alt-PSM may be used in methods such as the methods 110, 160, and 190. Consequently, improved resolution structures may be provided.

Figure 29:
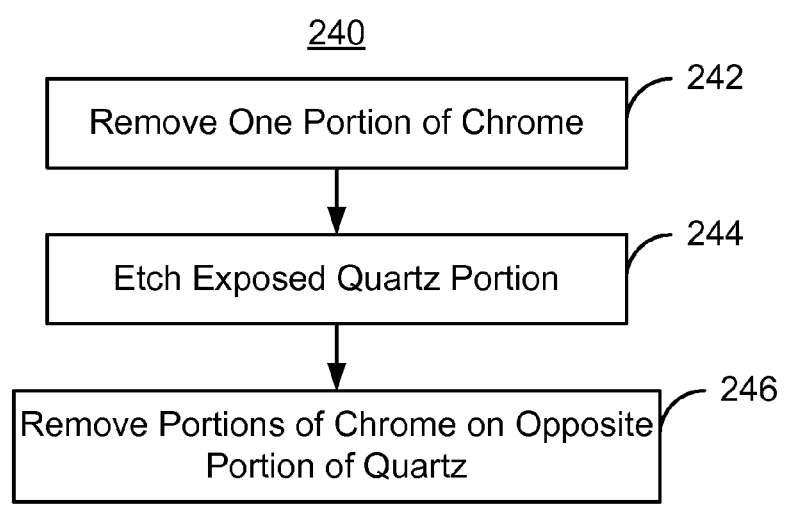
FIG. 29 is a flow chart depicting another exemplary embodiment of a method for providing a chromeless alternating phase shift mask.
Figure 30:
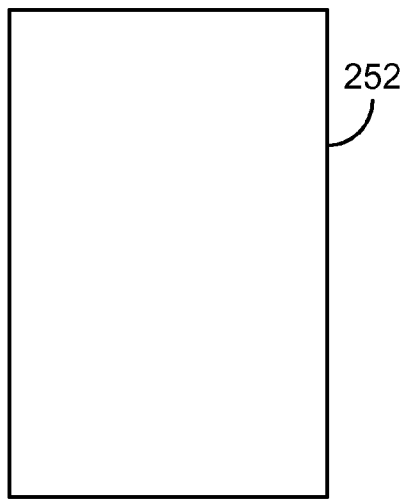
FIGS. 30-33 depict an exemplary embodiment of a chromeless alternating phase shift mask during fabrication.

FIG. 29 is a flow chart depicting another exemplary embodiment of a method 240 for providing a chromeless alt-PSM, such as the chromeless alt-PSM 120. The method 240 is described in connection with FIGS. 30-33, which depict plan views of an exemplary embodiment of a chromeless alt-PSM 250 during fabrication. Referring to FIGS. 29-33, the method 240 is formed from a layer of quartz covered in chrome. FIG. 30 depicts the chromeless alt-PSM 250 before the method 240 commences. Consequently, the chrome layer 252 is shown, while the underlying quartz is not.

Figure 31:
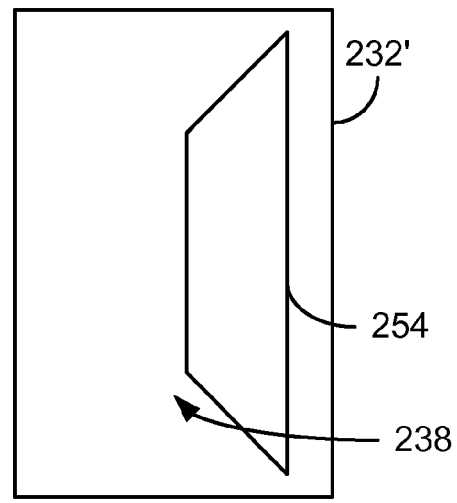

A portion of the chrome 252 is removed to expose a first quartz portion, via step 242. Step 242 may include forming a pattern on the chromeless alt-PSM 250 that exposes a portion of the chrome layer 252 and performing a chrome etch. FIG. 31 depicts the chromeless alt-PSM 250 after step 242 is completed. Thus, a portion 254 of the underlying quartz is exposed by the etched chrome 252'.

Figure 32:
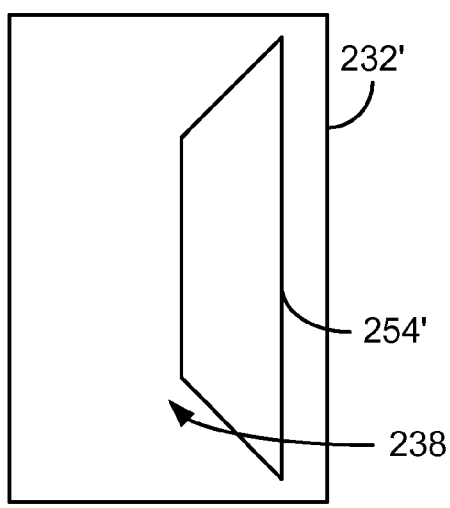

The exposed portion of the quartz is etched, via step 244. In one embodiment, step 224 includes performing a quartz etch such that the exposed quartz portion 254 transmits light that is one hundred and eighty degrees out of phase from the unetched quartz (not shown). FIG. 32 depicts the chromeless alt-PSM 250 after step 224 is completed. Thus, a quartz portion 254' is exposed by the etched chrome 252'. Consequently, the quartz portion 254' is thinner than the quartz portion 254 shown in FIG. 31.

Figure 33:
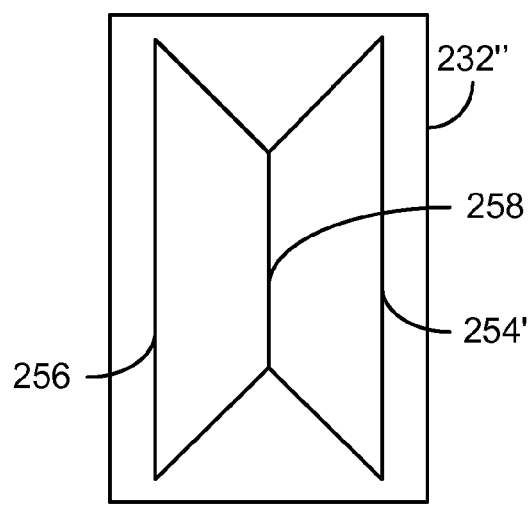

Another portion of the chrome layer 252' is removed, via step 246. Step 246 may include forming a pattern on the chromeless alt-PSM 250 that exposes the desired portion of the chrome layer 252' and performing a chrome etch. FIG. 33 depicts the chromeless alt-PSM 250 after step 246 is performed. Thus, another portion 256 of the underlying quartz layer has been exposed. Because the quartz portion 256 was covered in chrome during the quartz etch of step 244, the quartz portion 256 transmit light that is one hundred and eighty degrees out of phase with light transmitted by the quartz portion 254'. In addition, removal of a portion of the chrome 252' exposes a transition 258 between the quartz portions 254' and 256 having different thicknesses. In the chromeless alt-PSM 250, the quartz portions 254' and 256 and transition 258 correspond to the portions 122 and 124 and transition 126 of the chromeless alt-PSM 120.

Thus, using the method 240, a chromeless alt-PSM 250 having quartz regions 254' and 256 and a transition 258 therebetween may be formed. Consequently, the chromeless alt-PSM 250 may be used in fabricating microelectric devices, such as read transducers. Thus, the chromeless alt-PSM 250 may be used in methods such as the methods 110, 160, and 190. Consequently, improved resolution structures may be provided. Thus, using the methods 110, 160, and 190 and chromeless alt-PSM 120, 230, and/or 250, fabrication of smaller structures may be achieved.

We claim:

1. A method for providing a structure in a microelectric device comprising:

providing a mask layer on the microelectric device;

exposing the mask layer to provide a mask, a portion of the mask covering a portion of the microelectric device, the exposing the mask layer further including utilizing a chromeless alt-phase shift mask (chromeless alt-PSM) mask for providing the portion of the mask, the chromeless alt-PSM mask including a first region, a second region, and a transition between the first region and the second region, the transition corresponding to the portion of the mask and being free of an opaque material, the transition corresponding to a phase change between the first region and the second region for transmitted light, the first region having a border section free of the phase change for the transmitted light.

2. The method of claim 1 further comprising:

providing at least one structure layer, the mask layer residing on the at least one structure layer; and removing a portion of the at least one structure layer after the mask layer is exposed, a remaining portion of the at least one structure layer residing under the portion of the mask.

3. The method of claim 1 further comprising:

providing at least one structure layer on the mask; and lifting off the mask, the at least one structure layer having a trench therein corresponding to the portion of the mask.

4. The method of claim 1 wherein the structure is a read sensor.

5. The method of claim 1 wherein the structure has a width of not more than fifty nanometers.

6. The method of claim 1 further comprising:

forming the chromeless alt-PSM mask.

7. The method of claim 6 wherein the chromeless alt-PSM mask is formed from a quartz layer covered by a chrome layer and wherein forming the chromeless alt-PSM mask further includes:

removing a first portion and a second portion of the chrome layer, the first portion and the second portion of the chrome layer being separated by a chrome line, a first quartz portion being exposed by removal of the first portion of the chrome layer, a second quartz portion being exposed by removal of the second portion of the chrome layer the first quartz portion corresponding to the first portion of the chromeless alt-PSM mask, the second quartz portion corresponding to the second portion of the chromeless alt-PSM mask;

etching the second quartz portion of such that the phase change is one hundred eighty degrees between light transmitted by the first quartz portion and the second quartz portion; and removing the chrome line.

8. The method of claim 6 wherein the chromeless alt-PSM mask is formed from a quartz layer covered by a chrome layer and wherein forming the chromeless alt-PSM mask further includes:

removing a first portion of the chrome layer to expose a first quartz portion of the quartz layer, the first quartz portion corresponding to the first portion of the chromeless alt-PSM mask;

etching the first quartz portion such that the phase change is one hundred eighty degrees between light transmitted by the first quartz portion and a remaining portion of the quartz layer, the remaining portion of the quartz layer corresponding to the second portion of the chromeless alt-PSM mask;

removing a second portion of the chrome layer adjacent to the first portion of the quartz layer, a second quartz portion of the quartz layer being exposed by removal of the second portion.

9. A method for providing a read sensor in a magnetic head comprising:

providing at least one read sensor layer;

providing a mask layer on the at least one read sensor layer;

exposing the mask layer to provide a mask, a portion of the mask covering a portion of the at least one read sensor layer, the exposing the mask layer further including utilizing a chromeless alt-phase shift mask (chromeless alt-PSM) for providing the portion of the mask, the chromeless alt-PSM mask including a first region, a second region, and a transition between the first region and the second region, the transition corresponding to the portion of the mask and being free of opaque material, the transition corresponding to a phase change between the first region and the second region for transmitted light, the first region having a border section free of the phase change for the transmitted light;

defining the at least one read sensor using the mask, the one read sensor residing under the portion of the mask.

10. The method of claim 9 wherein the read sensor has a width of not more than fifty nanometers.

11. A method for providing a chromeless alt-phase shift mask (chromeless alt-PSM) mask from a quartz layer covered by a chrome layer, the method comprising:

removing a first portion and a second portion of the chrome layer, the first portion and the second portion of the chrome layer being separated by a chrome line, a first quartz portion being exposed by removal of the first portion of the chrome layer, a second quartz portion being exposed by removal of the second portion of the chrome layer;

etching the second quartz portion to form a transition such that a phase change of one hundred eighty degrees exists between light transmitted by the first quartz portion and the second quartz portion, the first quartz portion having a first border section, the second quartz portion having a second border section, at least one of the first border section and the second border section being free of the phase change for the light; and removing the chrome line such that the transition is free of an opaque material.

12. A method for providing a chromeless alt-phase shift mask (chromeless alt-PSM) mask from a quartz layer covered by a chrome layer, the method comprising:

removing a first portion of the chrome layer to expose a first quartz portion of the quartz layer;

etching the first quartz portion such that a phase change of one hundred eighty degrees exists between light transmitted by the first quartz portion and a remaining portion of the quartz layer;

removing a second portion of the chrome layer adjacent to the first portion of the quartz layer, a second quartz portion of the quartz layer being exposed by removal of the second portion and being adjacent to the first quartz portion along a transition, the first quartz portion having a first border section, the second quartz portion having a second border section, at least one of the first border section and the second border section being free of the phase change for the light, the transition being free of an opaque material.

* * * * *